US006384690B1

(12) United States Patent
Wilhelmsson et al.

(10) Patent No.: US 6,384,690 B1
(45) Date of Patent: May 7, 2002

(54) PHASE LOCKED LOOP CONTROL VIA INNER AND OUTER FEEDBACK CONTROL CIRCUITS

(75) Inventors: Mats Wilhelmsson, Älvsjö; Rolf Mårtensson, Bandhagen, both of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/529,118

(22) PCT Filed: Oct. 5, 1998

(86) PCT No.: PCT/SE98/01794

§ 371 Date: Apr. 7, 2000

§ 102(e) Date: Jul. 3, 2000

(87) PCT Pub. No.: WO99/22448

PCT Pub. Date: May 6, 1999

(30) Foreign Application Priority Data

Oct. 10, 1997 (SE) ............................................. 9703698

(51) Int. Cl.[7] ................................................ H03L 7/087

(52) U.S. Cl. ............................ 331/11; 331/25; 327/156

(58) Field of Search .............................. 331/10, 11, 12, 331/17, 25; 327/156–159; 360/51; 375/376; 455/260

(56) References Cited

U.S. PATENT DOCUMENTS 3,070,753 A * 12/1962 Smeulers ..................... 331/10
4,472,685 A * 9/1984 Dutasta ....................... 329/50
4,787,097 A 11/1988 Rizzo
4,829,258 A 5/1989 Volk et al.
5,216,698 A 6/1993 Boulanger et al.
5,254,958 A * 10/1993 Flach et al. ................... 331/10
5,463,351 A 10/1995 Marko et al.
5,666,084 A * 9/1997 Schulz et al. ............... 329/307
6,031,428 A * 2/2000 Hill ............................. 331/11

FOREIGN PATENT DOCUMENTS

EP 0 316 842 A2 5/1989
WO WO 99/22448 5/1999

OTHER PUBLICATIONS

International Search Report Date of Completion: Mar. 26, 2000; Date of Mailing: Mar. 29, 2000.

Authors: Torkel Glad and Tennart Ljung Title: "Reglerteknik", Subtitle: "Grundläggande teori", Publisher: Studentlitteratur Printed in Lund, Sweden in 1990, ISBN 91–44–17891–3, Title of the chapter: Chapter 6.2 "Kaskardreglering"; 2 pages.

Author: :Lászlo von Hámos, Title: "Reglerteori", Publisher: Svenska bokför laget Norstedts–Bonniers Printed in Stockholm, Sweden in 1968, Title of chapter: Chapter 15.5 "Kaskadreglering", pp. 178–180.

* cited by examiner

*Primary Examiner*—David Mis
(74) *Attorney, Agent, or Firm*—Burns, Doane, Swecker & Mathis, L.L.P.

(57) ABSTRACT

A phase locked loop includes at least one control circuit, where a voltage-controlled oscillator provides an output frequency which is arranged to strive to follow an input frequency. The phase locked loop also includes an outer, slow, negative feedback control circuit, having the input frequency as a setpoint, the output frequency as a process value and an outer output signal. The phase locked loop also includes an inner, fast, negative feedback control circuit, having the sum of a reference frequency from a stable oscillator and the outer output signal as a setpoint, the output frequency as the process value and an inner output signal for controlling the voltage controlled oscillator.

11 Claims, 3 Drawing Sheets

PHASE LOCKED LOOP CONTROL VIA INNER AND OUTER FEEDBACK CONTROL CIRCUITS

TECHNICAL FIELD

The present invention is related to control of a voltage-controlled oscillator, preferably in a phase locked loop.

STATE OF THE ART

Phase Locked Loops (PLL) are used, e.g. for obtaining an output clock frequency which follows an input clock frequency.

A phase locked loop can for example comprise a voltage-controlled oscillator (VCO), which generates a frequency depending on an input voltage. However, such an oscillator is not in practice ideal since the output frequency can be affected by, for example, the supply voltage, temperature, aging of components, humidity and atmospheric pressure. Therefore, the oscillator should be comprised in some type of control circuit. A number of different control circuits are possible.

In the U.S. patent U.S. Pat. No. 4,787,097, a phase locked loop having a feed back control circuit is shown.

In the U.S. patent U.S. Pat. No. 5,463,351, a phase locked loop having two parallel feed back control circuits, where either the first or the second of the control circuits is selected is shown.

In the U.S. patent U.S. Pat. No. 4,829,258, a phase locked loop having two feed back control circuits connected in series is shown.

SUMMARY

The present invention is based on the understanding that there are two contradictory problems to solve in the design of a control circuit for a voltage controlled oscillator, which is to generate an output frequency which is to follow an input frequency.

The first problem is that normally it is not desired that the output frequency follows the input frequency exactly, jitter in the input frequency signal should be attenuated. This requires a relatively slow control circuit having a relatively low limit frequency.

The other problem is that a voltage controlled oscillator is affected by for example supply voltage, temperature, aging of components, humidity and atmospheric pressure. This requires a relatively fast control circuit having a relatively high limit frequency.

None of the documents described in the state of the art has been able to identify these two contradictory problems and has not been able to solve them.

The object of the present invention is to solve these two problems using a circuit a bit like a cascade circuit. A fast inner control circuit, having an inner controller and a stable oscillator is used to remove the noise in the voltage-controlled oscillator.

An outer slow control circuit having an outer controller is used in order for the output frequency to follow the input frequency, without following possible jitter in the input frequency.

Simplified, one could say that the inner control circuit is used to provide a stable "basic frequency" in the output frequency. The deviations in the input frequency from the basic frequency is then added to this basic frequency, resulting in that the output frequency follows the input frequency in a "soft" way.

The advantage of the invention is that noise in the voltage-controlled oscillator is removed at the same time as the input frequency is followed and that jitter in the input frequency is attenuated. Other advantages are good frequency and phase stability and that a large working range is obtained and that a low limit frequency (cut off frequency, modulation band width) can be used for attenuating the jitter in the input frequency.

In one embodiment phase meters are used for calculating phase differences, despite that the voltage controlled oscillator primarily controls the frequency. The problem with this is that it becomes necessary to consider both phase and frequency simultaneously. The embodiment relies on the understanding that a phase difference can be seen as an integration of frequency difference and thus either a differentiation or an integration must be provided at suitable locations. According to the embodiment an additional integration is provided in the outer control circuit making the outer control circuit generate an outer output signal consisting of a phase ramp. The advantage of this embodiment is that a simple useful circuit without unnecessary elements is obtained.

An alternative to this embodiment relies on the understanding that the frequency integrations in the inner control circuit will provide phase ramps, but that a phase meter only has a limited range, such as −180° to 180°, which results in a phase jump of +360° and −360°, respectively, at the interval boundaries. This problem is solved by making a corresponding compensation of −360° and +360°, respectively, on the output signal from the outer controller.

In one embodiment the location of an addition and a subtraction according to $A+(B-C)=(A+B)-C$ is interchanged in the implementation. The advantage of this embodiment is that a simple circuit without any unnecessary elements is obtained.

One embodiment relies on the understanding that there may be problems if the input frequency signal disappears. This is solved according to the embodiments by that, simply put, the outer controller is "frozen" so that the outer output signal provides the same phase ramp as before the signal disappeared. The advantage of this is that a relatively good output frequency is obtained even in the case of an error in the input frequency signal.

The invention will now be described in more detail by means of preferred embodiments and with reference to the accompanying drawings.

DESCRIPTION OF PREFERRED EMBODIMENTS

Figure 1:
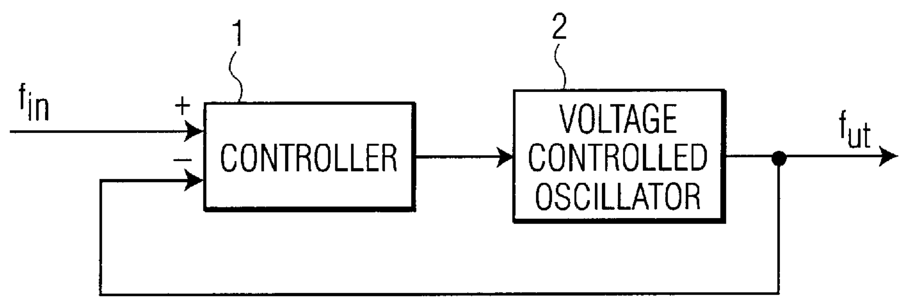
FIG. 1 schematically shows a voltage-controlled oscillator in a feedback control circuit.

A voltage-controlled oscillator (VCO) is an oscillator having an output frequency which can be controlled by a reference voltage. A voltage controlled oscillator is however rarely ideal and in order to be sure of the obtained output frequency it is suitable to let the oscillator be part of some type of feedback circuit. What this could look like is briefly shown in FIG. 1.

A controller 1 receives an input frequency $f_{in}$ which is to be followed, and an output frequency $f_{ut}$ from a voltage controlled oscillator 2. In response to the difference between the input frequency $f_{in}$ and output frequency $f_{ut}$ the controller 1 generates an output signal which controls the oscillator 2 towards the input frequency $f_{in}$.

The interferences which may affect the oscillator 2 can for example be variations in temperature and supply voltage. It is desirable that these interferences are eliminated as quickly as possible. The control circuit 1 should therefore be fast.

On the other hand it is not desirable from a stability point of view that the output frequency $f_{ut}$ follows the input frequency $f_{in}$ too quickly. Possible jitter in the signal with the input frequency $f_{in}$ should be attenuated. The controller 1 should therefore be slow.

Conclusion: the controller 1 should both be fast and slow. Impossible?

Figure 3:
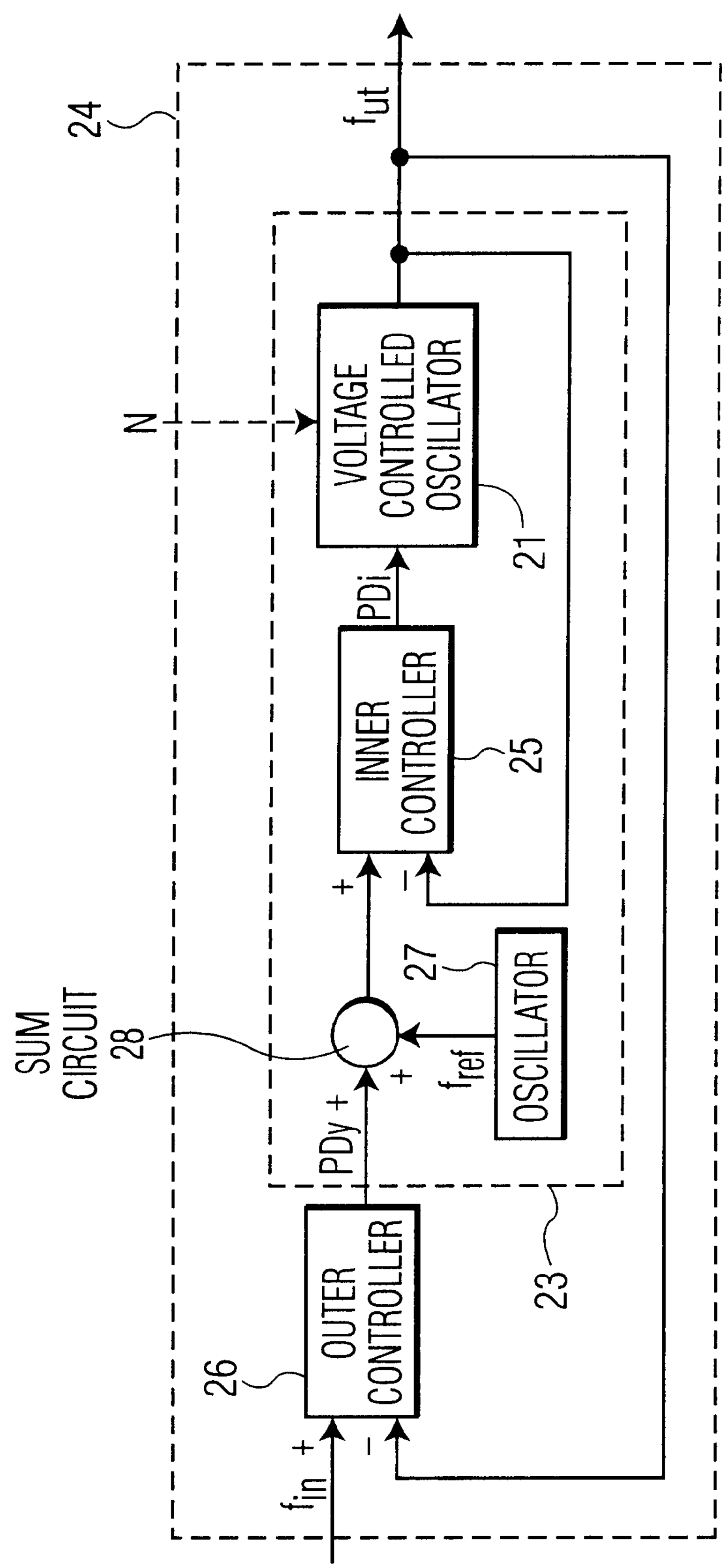
FIG. 3 schematically shows a voltage controlled controller according to the invention in a circuit a bit like a cascade circuit.

The present invention is based on that these contradictory problems are realized and by solving them with a circuit a bit like a cascade circuit, which in a simplified version is shown in FIG. 3.

Figure 2:
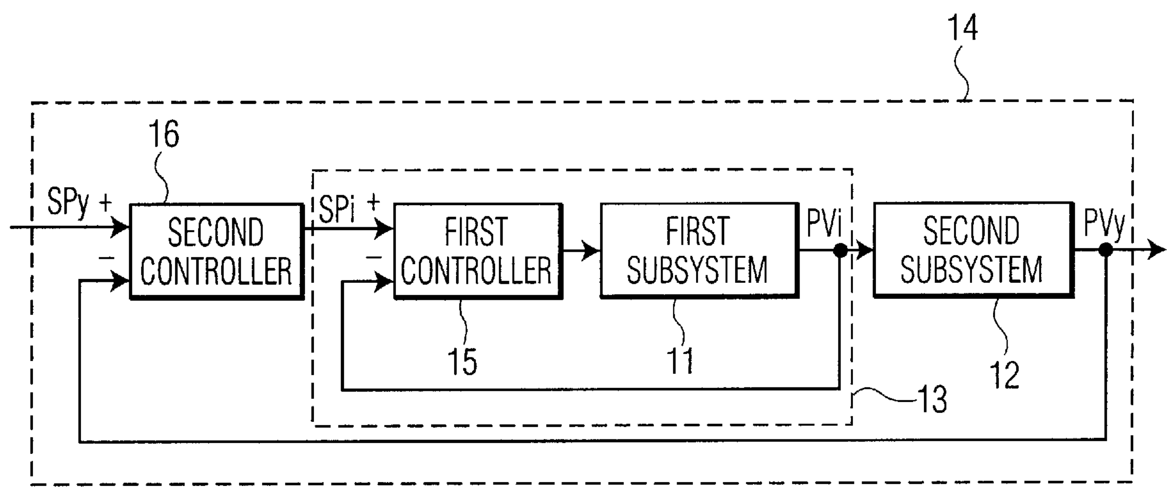
FIG. 2 schematically shows a cascade connected control circuit according to the state of the art.

However, first a cascade type control circuit previously known from general control applications is considered in FIG. 2. The system to be controlled comprises two subsystems 11, 12 connected in series which are controlled by two feedback control circuits 13, 14 located inside each other.

In an inner fast control circuit 13 a first controller 15 control the first subsystem 11 in response to a first input parameter SPi, which results in a first output parameter PVi, which is fed back to the first controller 15. The first output parameter PVi in turn acts on the second subsystem 12, which in its turn provides a second output parameter PVy, which is fed back in an outer slow control circuit 14 to the second controller 16. The second controller 16 in turn controls the first controller 15 using a second input parameter SPy.

Thus, the object is to control the second output parameter PVy by using the second input parameter SPy in order to control the first output parameter PVi. A common example is to control the temperature of a fluid by means of controlling a cooling water flow. Interested readers can read more in for example Glad, Ljung: "Reglerteknik. Grundläggande teori", chapter 6.2 or Hamos: "Reglerteori", chapter 15.5.

It is however not known to use a cascade circuit in order to control a voltage-controlled oscillator. To control frequencies and phase poses special problems. Also, it is not possible to divide the system into subsystems, which is one of the main ideas for using a cascade circuit. Instead, a control circuit which is briefly shown in FIG. 3 is used according to the invention.

Very simplified the circuit operates according to the following:

A stable non-modulatable oscillator 27 is used, the frequency of which is divided to a reference frequency $f_{ref}$ which is close to an input frequency $f_{in}$ which an output $f_{ut}$ is to follow. This reference frequency $f_{ref}$ is fed, via a sum circuit 28, into an inner controller 25 in an inner fast control circuit 23. The function of the sum circuit 28 will be explained below.

The inner controller 25 then provides an inner output signal PDi, which controls a voltage controlled oscillator 21, which in turn provides an output frequency $f_{ut}$, which is fed back to the inner controller 25.

Thus, in order to eliminate noise N in the voltage controlled oscillator 21 a fast inner control circuit 23 and a constant frequency $f_{ref}$ from a stable oscillator 27 is used.

The input frequency $f_{in}$ is fed to an outer controller 26 in an outer slow control circuit 24. The outer controller 26 then provides an outer output signal PDy which is summed 28 with the reference frequency $f_{ref}$, whereupon the sum is fed to the inner controller 25. The outer controller 26 thus controls the output frequency $f_{ut}$ via the inner controller 25. Finally the output frequency $f_{ut}$ is fed back to the outer controller 26.

Thus, in order for the output frequency $f_{ut}$ to follow the input frequency $f_{in}$, without following possible jitter in the input frequency $f_{in}$, a slow outer control circuit 24 is used.

One could say that the inner control circuit 23 is used to provide a stable "basic frequency" in the output frequency $f_{ut}$, having the interferences in the voltage controlled oscillator 21 eliminated. The deviations of the input frequency $f_{in}$ from the basic frequency are then added to the basic frequency, which results in that the output frequency $f_{ut}$ follows the input frequency $f_{in}$ in a soft way.

In one area of automatic engineering it is common to look at it from the controller point of view and then draw the signals directly to the control circuit, as in FIGS. 2 and 3, the signal to be controlled is called "process value", the signal to be controlled after is called "setpoint" or "reference value" and the output signal from the controller is called "process demand". "Control errors" are often defined as setpoint minus process value.

Accordingly, in the outer control circuit 24 the input frequency $f_{in}$ is the setpoint, the output frequency $f_{ut}$ is the process value and the output signal PDy from the outer controller is the process demand. However, in the inner control circuit 23 the outer output signal PDy from the outer control circuit added with the reference frequency $f_{ref}$ is the "setpoint", the output frequency $f_{ut}$ is the process value and the inner output signal PDi from the inner controller is the process demand.

In practice some complications can arise in the implementation. Therefore, a practical embodiment is explained below. It is however to be understood that also other embodiments are possible as long as the function in FIG. 3 is obtained.

Figure 4:
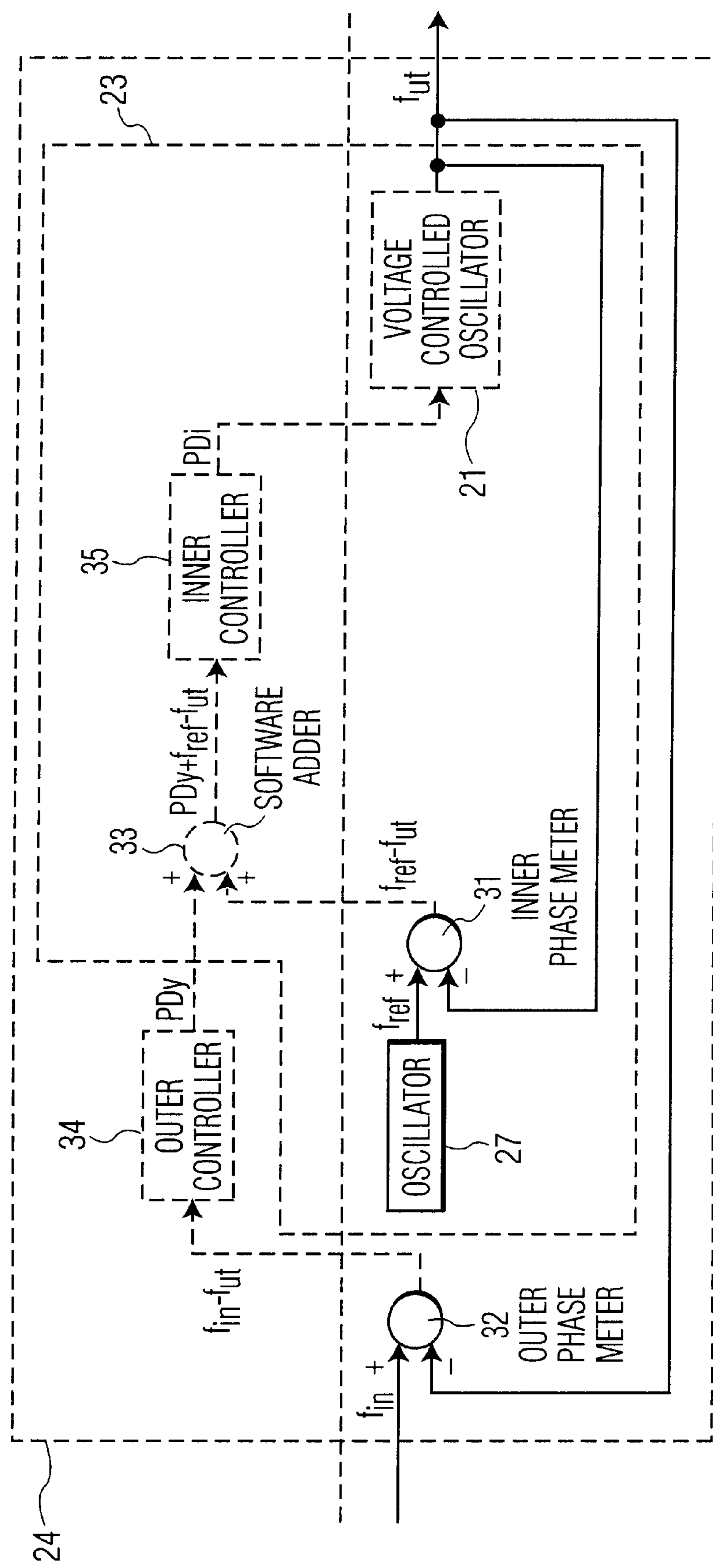
FIG. 4 shows a more detailed implementation of the control circuit in FIG. 3.

The embodiment is shown in FIG. 4, using the same reference numerals as in FIG. 3. It is however to be noted that the subtractions in FIG. 4 are shown separately from the controllers in contrast to FIG. 3. Software implementation is shown with a dashed line in the upper part of the figure, whereas hardware implementation is shown with continuous lines in the lower part of the figure.

It is most suitable to implement the controllers in software in order to achieve desired limit frequencies. It is however possible to implement the controllers in hardware instead.

It was previously stated that the frequency was to be controlled. In practice it is however probably easiest to control the phase. Thus, a phase meter 31, 32 is used to detect phase differences. For reasons of implementation it can then also be suitable to interchange the location of the addition and subtraction before the inner controller 35. As is known A+(B−C)=(A+B)−C.

This results in that the setpoint in the inner control circuit 23 can not be obtained directly (if anyone would like this), but it is only implicit in the circuit.

The reason for that it is suitable to interchange the place of the addition and subtraction is that the outer controller 34 provides a digital signal, whereas the stable oscillator 27 provides a frequency signal. In order to add these two signals some kind of converter would be required.

The phase meter however receives two frequency signals, measures (i.e. counts) the phase difference between them and generates a digital signal which represents the phase difference. The phase meter can therefore in a way be seen as a converter. To interchange the place of the subtraction and addition it is therefore an intelligent way of obtaining a simple circuit solution.

Thus, in the inner control circuit 23 the phase of the output frequency $f_{ut}$ is subtracted from the phase of the reference frequency $f_{ref}$ in an inner phase meter 31. The inner phase difference $f_{ref}-f_{ut}$, which is in a digital form, is added in software 33 to the outer output signal PDy from the, in this case, software implemented, outer controller 34. The sum $PDy+(f_{ref}-f_{ut})$ corresponds to an inner control error $(PDy+f_{ref})-f_{ut}$ which is fed to the, in this case software implemented, inner controller 35.

The inner output signal PDi from the inner controller is fed, via a not shown D/A converter, as a voltage to the voltage controlled oscillator 21, which as stated earlier provides an output frequency $f_{ut}$.

In the outer control circuit 24 the phase of the output frequency $f_{ut}$ is subtracted from the phase of the input frequency $f_{in}$ in an outer phase meter 32. The difference in phase, i.e. the outer control error $f_{in}-f_{ut}$, which in this case is in a digital form, is fed to the outer controller 34 which provides an outer output signal PDy, which, as has already been stated, is added in software 33 to the inner phase difference $f_{ref}-f_{ut}$ from the inner phase meter 31.

The complete control circuit thus controls phase, but the voltage controlled oscillator 21 strictly speaking does not control the phase, but the frequency. Since phase difference can be seen as an integration of frequency difference, the oscillators 21, 27 can be seen as having built-in integration functions. This should be observed in the remainder of the circuit.

The inner phase meter 31 counts the difference between the phase of the reference frequency $f_{ref}$ and the phase of the output frequency $f_{ut}$. Since the output frequency $f_{ut}$ is also controlled by the input frequency $f_{in}$, there will in practice always be an inner phase difference $f_{ref}-f_{ut}$ which is not equal to zero from the inner phase meter 31, i.e. a phase ramp is obtained.

The inner phase difference $f_{ref}-f_{ut}$ shall, as has been stated, be added to the outer output signal PDy. This results in the inner control error $PDy+f_{ref}-f_{ut}$, which is fed to the inner controller 35. If the inner controller 35 were to control using a phase ramp as input signal a complicated controller would be required. Furthermore, the contribution from the outer output signal PDy would loose in significance the larger the phase ramp became, which in the long run would result in that the output frequency $f_{ut}$ would stop following the input frequency $f_{in}$.

In order to obtain the desired function in the control circuit, the inner control error $PDy+f_{ref}-f_{ut}$ should therefore preferably not be in the shape of a phase ramp. The simplest way of obtaining this is to let the outer controller 34 provide a phase ramp which corresponds to the phase ramp from the inner phase meter 31, but with a different sign. This can be obtained by letting the outer controller 34 comprise an additional integration.

Theoretically one could instead differentiate the frequency signals from the oscillators 21, 27 but this would probably be more complicated to implement in practice.

A conventional controller can, as a basic rule, have three different control parameters, which can be summed as follows: A large proportional parameter $k_p$ will result in an increased speed in the controller, but also most often to a reduced stability. The use of an integral parameter $k_i$ will eliminate remaining errors in the output signal, but reduces stability the larger the parameter becomes. The use of a derivative parameter $k_d$ can increase stability, but differentiation of noisy measured signals can be hazardous. A careful balance of said parameters is thus required depending on the requirements to the controlling.

The inner controller 35 can suitably have a control function (filter function) which in Laplaceform is written as follows:

$$k_{pi}\cdot\left(1+\frac{k_{ii}}{S}\right),$$

i.e. a proportional parameter and an integral parameter. The addition of a derivative parameter is possible, but not necessary.

The outer control circuit can on the other hand suitably have a function which in Laplaceform is written as follows:

$$k_{py}\cdot\left(1+\frac{k_{iy}}{S}\right)\cdot\frac{1}{S},$$

i.e. a proportional parameter and an integral parameter, and an additional integration in order to provide a ramp. The addition of a derivative parameter is possible, but not necessary.

It can be added that in practice there are three different types of controller implementations which usually are used—ideal, serial (also called lead-lag) and parallel. In these different types the proportional parameter, the integral parameter and the derivative parameter are designed and combined in somewhat different manners. They are however so alike and function in such similar manners that in this context they must be regarded as equivalent.

The fact that the inner phase meter 31 generates a phase ramp also results in another problem. A phase meter normally operates in the range −180° to +180°. Every time the phase meter crosses the range boundary it thus jumps +360° or −360°. The outer controller 34 however provides a continuous output signal PDy.

This is simplest compensated by adding −360° and +360°, respectively to the output signal PDy from the outer controller, so that after the addition 33 there is no jump in the inner control error $PDy+f_{ref}-f_{ut}$ which is fed to the inner controller 35.

If the signal with the input frequency fin should disappear another problem occurs. The voltage-controlled oscillator 21 can in this case in an easy manner be set to continue generating the same frequency as before the disappearance of the signal having the input frequency $f_{in}$. This is obtained by feeding a constant value zero to the outer controller 34 instead of the outer control error from the outer phase meter 32.

Hereby the outer controller 34 believes that there is no control error and will therefore continue to generate the same phase ramp as before.

What is claimed is:

1. A phase locked loop comprising:

at least one control circuit, in which a voltage controlled oscillator generates an output frequency, arranged to follow an input frequency;

an outer, slow, negative feedback control circuit, having the input frequency as setpoint, the output frequency as process value, and an outer output signal; and an inner, fast, negative feedback control circuit having the sum of a reference frequency from a stable oscillator and the outer output signal as setpoint, the output frequency as process value and an inner output signal connected to control the voltage controlled oscillator.

2. A phase locked loop according to claim 1, wherein the outer control circuit comprises an outer phase meter and an outer controller, wherein the outer phase meter is arranged to subtract the output frequency from the input frequency and to provide an outer control error to the outer controller, wherein the outer controller is arranged to provide the outer output signal, wherein the inner control circuit comprises an inner phase meter, an adder and an inner controller, wherein the inner phase meter is arranged to subtract the output frequency from the reference frequency and to provide an inner frequency difference to the adder, wherein the adder is arranged to add the inner frequency difference to the outer output signal and to provide a sum to the inner controller, and wherein the inner controller is arranged to provide the inner output signal.

3. A phase locked loop according to claim 2, wherein the inner controller comprises a proportional parameter, an integral parameter and optionally a derivative parameter, and wherein the outer controller comprises a proportional parameter, an integral parameter, an additional integration and optionally a derivative parameter.

4. A phase locked loop according to claim 2, wherein the outer controller is arranged to add +360° to the outer signal if the inner frequency difference jumps −360°, and wherein the outer controller is arranged to add −360° to the outer output signal if the inner frequency difference jumps +360°.

5. A phase locked loop according to claim 2, wherein the outer controller is arranged to receive a zero signal instead of the outer control error if the signal with the input frequency disappears.

6. A method of controlling a voltage controlled oscillator which provides an output frequency striving to follow an input frequency, wherein jitter in the input frequency signal is eliminated in an outer, slow, negative feedback control circuit and wherein interferences in the voltage controlled oscillator is eliminated in an inner, fast, negative feedback control circuit.

7. A method according to claim 6, wherein in the outer control circuit the input frequency is used as setpoint and the output frequency as process value, and wherein in the inner control circuit the sum of a reference frequency from a stable oscillator and the outer output signal is used as setpoint and the output frequency as process value.

8. A method according to claim 6, wherein an outer phase meter subtracts the output frequency from the input frequency and provides an outer control error to an outer controller, wherein the outer controller provides an outer output signal, wherein an inner phase meter subtracts the output frequency from the reference frequency and provides an inner frequency difference to an adder, wherein the adder adds the inner frequency difference to the outer output signal and provides a sum to an inner controller, and wherein the inner controller provides an inner output signal.

9. A method according to claim 8, wherein the outer output signal is formed by filtering the outer control error using a proportional parameter, an integral parameter, an optional derivative parameter, and an additional integration.

10. A method according to claim 8, wherein the outer controller adds +360° to the outer output signal if the inner frequency difference jumps −360° and wherein the outer controller adds −360° to the outer output signal if the inner frequency difference jumps +360° C.

11. A method according to claim 8, wherein the outer controller receives a zero signal instead of the outer control error if the signal with the input frequency disappears.

* * * * *